United States Patent

Meek

[15] 3,642,593

[45] Feb. 15, 1972

[54] METHOD OF PREPARING SLICES OF A SEMICONDUCTOR MATERIAL HAVING DISCRETE DOPED REGIONS

[72] Inventor: Ronald Lee Meek, Pottersville, N.J.

[73] Assignee: Bell Telephone Laboratories, Incorporated, Murray Hill, N.J.

[22] Filed: July 31, 1970

[21] Appl. No.: 59,977

[52] U.S. Cl. ......................204/143 GE, 148/1.5, 204/143 R
[51] Int. Cl. ..........................................................B23p 1/00
[58] Field of Search ..................204/143 GE, 143 R; 148/1.5

[56] References Cited

UNITED STATES PATENTS

| | | | |
|---|---|---|---|
| 3,536,600 | 10/1970 | Van Disk et al | 204/143 R |
| 3,523,042 | 8/1970 | Bower et al | 148/1.5 |
| 3,390,019 | 6/1968 | Manchester | 148/1.5 |

*Primary Examiner*—John H. Mack
*Assistant Examiner*—Neil A. Kaplan
*Attorney*—R. J. Guenther and Edwin B. Cave

[57] ABSTRACT

A method of preparing slices of semiconductor material, having a first type of conductivity, which slice has discrete doped regions, is disclosed. The method consists of preparing or selecting a block of semiconductive material having at least one first region of the first conductivity type and at least one second region of a different conductivity which is more rapidly electroetched than the first conductivity type region. The block is exposed to an ion implantation source which implants suitable ions in at least one discrete portion of the first region. The ion-implanted block is then subjected to an electroetching treatment whereby the second region is selectively etched thereby resulting in the formation of a slice of the first conductivity type material, having suitable ions implanted therein. The slice is then subjected to an annealing or heat treatment whereby the implanted ions are activated resulting in a slice having discrete regions having different conductivity.

4 Claims, 9 Drawing Figures

INVENTOR
R. L. MEEK
BY
Edward M. Fink
ATTORNEY

METHOD OF PREPARING SLICES OF A SEMICONDUCTOR MATERIAL HAVING DISCRETE DOPED REGIONS

BACKGROUND OF THE INVENTION

1. Field of the Invention

This invention relates to a method of preparing slices of a semiconductor material having discrete doped regions and more particularly, to a method of forming the desired doped semiconductor through electrochemical thinning of ion-implanted semiconductor material.

2. Description of the Prior Art

There are many applications in the manufacture of semiconductive devices, particularly in high-frequency devices, where it is necessary to have relatively thin slices of material. A recent Dutch Pat. application, No. 6,703,013, has revealed a process whereby ultrathin ($1\mu$) semiconductor slices have been produced. A selective electrolytic etching process is involved whereby a semiconductor substrate, having a finite resistivity, has a thin epitaxial layer of the same material deposited thereon, suitably doped however as to give different resistivity than the substrate material. The substrate material is then subjected to electrochemical dissolution whereby the substrate is dissolved leaving a thin semiconductor slice, i.e., the epitaxially deposited material.

However, if a thin semiconductor slice having discrete doped regions of different conductivity is desired, the above process cannot be employed where such discrete different conductivity regions have been obtained through a diffusion process. It has been found in the electrochemical thinning process, outlined above, of *n*/*n*+ silicon wafers which have diffused *n*+ doped regions in the *n* layer, or diffused *p*-type doped regions in the *n* layer which extend through the *n* layer to the *n*+ layer, that the *n*-type material adjacent to the *p* regions or below any *n*+ doped diffusion is slowly etched thereby leading to removal of both the *n*-type material and the diffused regions. A method whereby electrochemical thinning may be employed to obtain thin slices of semiconductor material having discrete doped regions, of any configuration, is therefore in great need.

SUMMARY OF THE INVENTION

The present invention is directed to a method for preparing thin slices of semiconductor material of a first conductivity type, having therein at least one discrete portion of different conductivity. The method is one which exposes a suitable block of semiconductive material, having therein at least one first region of the first conductivity type and at least one second region of a different conductivity, which is more rapidly electroetched than the first region, to an ion-implantation source. The block may comprise one material having different conductive layers or it may comprise a wafer or block having discrete conductive regions or layers of different material. The block is subjected to the ion-implantation source so as to implant suitable ions into at least one discrete portion of the first region of the first conductivity type. The implanted ions are those, well known in the art, which will give, upon subsequent activation, the doped portions or regions desired but which at this stage are hypothesized to be in interstitial positions whereby they do not evidence acceptor or donor properties.

The ion-implanted block is then immersed in a suitable electroetching bath wherein a sufficient current density is maintained to selectively etch the second region to form a thin slice of first conductivity type material having the suitable ions implanted therein. The thin slice is finally heat treated to activate the implanted ions so that they alter the conductivity of the regions in which they are contained thereby forming discrete portions of different conductivity, i.e., suitably doped portions or regions.

BRIEF DESCRIPTION OF THE DRAWING

The present invention will be more readily understood by reference to the following drawing taken in conjunction with the detailed description wherein.

DETAILED DESCRIPTION

The present invention has been described largely in terms of making thin slices of silicon, having discrete doped regions therein, employing epitaxial growth upon a silicon substrate. However, it will be understood that such description is for purposes of exposition and not for purposes of limitation. The method can be employed for the production of thin slices or slices of any dimension of any single crystal semiconductor, which can be selectively etched electrochemically. It will be readily appreciated that the inventive concept is equally applicable to semiconductor materials which may be epitaxially deposited as either homojunctions or heterojunctions. The semiconductor materials may be selected from among the groups III(*a*)–V(*a*) and II(*b*)–VI(*a*) compounds or group IV elements of the Periodic Table of the Elements as Mendelyeev periodic table appearing on page B2 of the 45th edition of the *Handbook of Chemistry and Physics*, published by the Chemical Rubber Company.

Figure 1A:
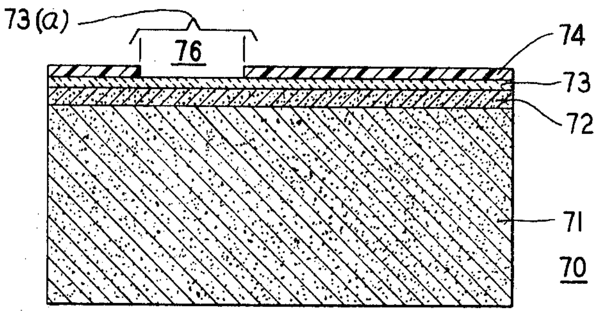
FIG. 1A is a cross-sectional view of a block of semiconductive material having thereon an ion-implantation passivating layer and a photoresist masking layer.

Referring to FIG. 1A, a block of semiconductive material 70 is prepared. The block 70 comprises a suitable substrate or base layer 71, which may be a semiconductor material, e.g., *n*+ silicon. A suitable substrate material is one which is capable of being electrochemically etched. Deposited upon the substrate 71 is a thin layer or region 72, typically $1\mu$–$10\mu$ in thickness, of a semiconductor material, which may be epitaxially grown thereon either through liquid or gaseous phase crystal growth techniques well known in the art.

The substrate material 71, e.g., *n*+ silicon, is one which is heavily doped and has a finite resistance; however, layer 72 is one which has been either doped to give a higher resistivity, e.g., *n*-type silicon, or is a different material with a different resistivity.

Deposited on layer 72 is a suitable masking layer 73 which may be thermally grown, or formed by evaporation, sputtering or other techniques well known in the art. A suitable masking layer is one which will mask or shield the underlying areas of layer 72, i.e., underlying layer 73, from the ionic bombardment to which block 70 is destined to be subjected. Depending upon the particular application and the semiconductor layer 72 chosen, the masking layer 73 may be an inert dielectric, e.g., silicon oxide, aluminum oxide, silicon nitride, or a conductive material such as a metal, e.g., Au, Pt, Ni, or a combination of discrete layers composed of both dielectrics and conductors. However, the type of ionic bombardment passivating layer and its thickness are not part of the invention disclosed herein and the particulars concerning its selection and thickness are particulars well known to those skilled in the art and will not be discussed.

Figure 1B:
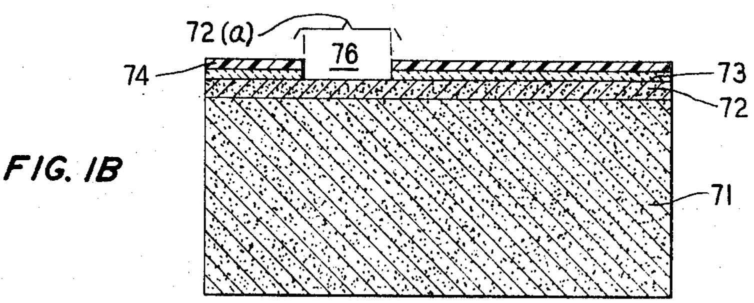
FIG. 1B is a cross-sectional view of the block of FIG. 1A after a portion of the passivating layer has been removed.

A standard photoresist, known in the art, is applied to masking layer 73 to form a photoresist layer 74. The photoresist layer 74 is formed in a pattern, by means well known in the art, so that it has an aperture 76. It is, of course, understood that although only one aperture is shown, this is for illustrative purposes only and a plurality of apertures may be formed therein, or any particular pattern desired whereby masking layer 73 is exposed. The block 70 is then exposed to an ambient which removes the exposed area 73(*a*) of layer 73, but which does not attack either the photoresist layer 74 or layer 72. The ambient of course depends upon the masking layer material selected as well as by layers 74 and 72 and can be easily determined by those skilled in the art. Layer 72 now has an exposed surface area or portion 72(*a*) as shown in FIG. 1B.

Figure 1C:
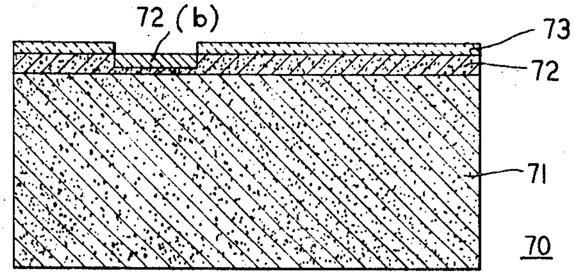
FIG. 1C is a cross-sectional view of the block of FIG. 1B after exposure to an ion-implantation source.

The photoresist layer 74 is removed by standard procedures known in the art, and the block 70 is subjected to a standard ion implantation source known in the art, whereby suitable ions or impurities are implanted in a discrete portion 72(*b*) of region or layer 72, as illustrated in FIG. 1C. Suitable ions or impurities are those ions which, upon subsequent activation or annealing, impart different conductivity characteristics to the discrete portion implanted, i.e., area 72(*b*), as compared to the bulk area or region 72. The ions or impurities change the semiconductive region 72(*b*) in either type or in magnitude when the implanted ions are subsequently activated, as for example, where layer 72 is *n*-type silicon the impurities or implanted ions can change the area or discrete portion 72(*b*) to either *n*+ silicon or *p*-type silicon, depending, of course, on the implanted ions utilized. It should be noted here, that the depth of the implantation, i.e., of area 72(*b*), can be controlled by the amount of energy given to the ions during the bombardment of block 70.

Figure 2:
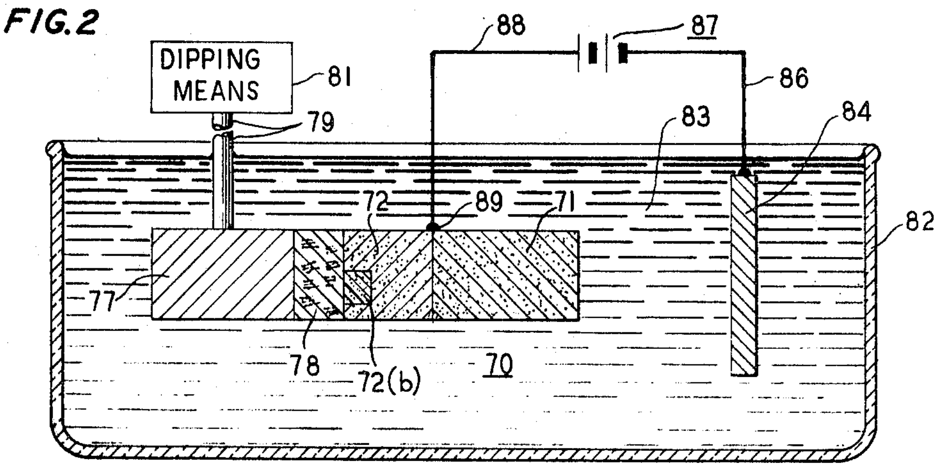
FIG. 2 is a cross-sectional view of the ion-implanted block contained within a typical electrochemical etching apparatus.

Referring to FIG. 2, masking layer 73 is removed from layer 72 by means of the above-mentioned ambient, which does not attack layer 72. It is to be noted that for some applications masking layer 73 may be retained and suitably protected or masked from an electrolytic etching bath to which the implanted block 70 is destined to be subjected. The ion implanted block 70 having discrete regions of differing conductivity, i.e., substrate 71, e.g., *n*+ silicon, with layer 72, e.g., *n*-type silicon, formed thereon, is affixed, at layer 72, to an inert carrier 77 by means of a suitable adhesive or wax 78, e.g., paraffin. Suitable inert carriers 77 and adhesives 78 comprise materials which are inert to the reagents destined to be employed in the electrochemical etching of the substrate material 71. The inert carrier 77 in turn is affixed by means of rod 79, fabricated of the same material as the carrier 77, to a standard dipping or lowering means 81.

A suitable container 82 made of an inert material which does not react with a suitable electrochemical bath reagent 83 contained therein, is selected. A suitable bath reagent is one which is capable of conducting electricity, i.e., is an electrolyte, and is capable of etching the selected substrate material 71. Typical electrolytes are, for example, LiOH, KOH, NaOH solutions, hydrofluoric and hydrochloric acids. It should be noted that the concentration of the electrolyte is not critical.

The ion implanted block 70 with its different resistivity substrate 71, its ion-implanted layer 72, and the dipping means 81 are placed directly over container 82 housing the electrochemical etching bath reagent 83. A suitable auxiliary electrode 84 is immersed in the electrolyte 83. A suitable electrode 84 is one which is inert to and does not react with the electrolyte liquid 83 chosen. Electrode 84 is shown connected by means 86 to the negative pole of a direct current power supply 87, e.g., a battery. The substrate 71 and layer 72 are connected by means 88 to the positive pole of the direct current source 87 at the junction 89 of the substrate 71 and layer 72. It is, of course, understood that the connections 86, 88 are suitably masked to prevent interaction with electrolyte 83.

Figure 3:
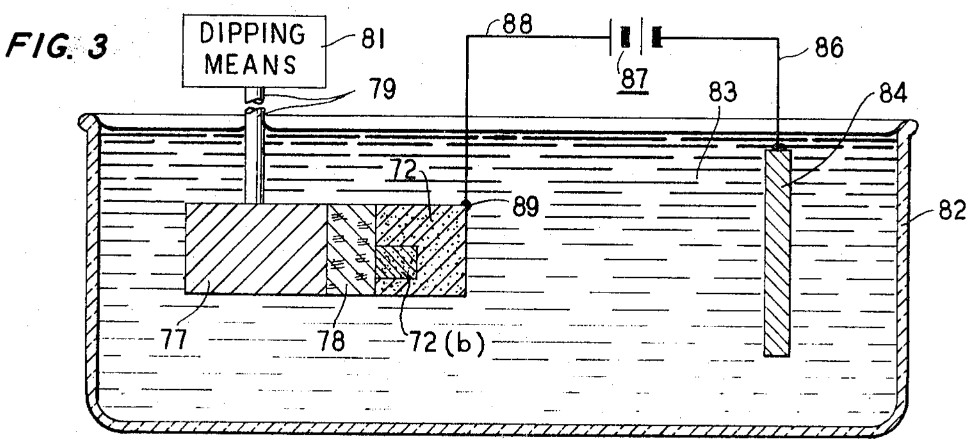
FIG. 3 is a cross-sectional view of the electroetched ion-implanted block within the electrochemical etching apparatus.

The ion-implanted block 70 composed of the substrate region 71 and the higher resistivity region 72, having implanted ions in a discrete portion 72(*b*), is made electrically positive with respect to the electrode 84. The dipping means 81 then lowers the assembled carrier 77 and block 70 into the electrochemical bath reagent 83. Voltage is then applied to the substrate 71 and layer 72 to establish a sufficient current density with the electrochemical bath 83. The current density established is sufficient to selectively electroetch region 71, i.e., the higher conductivity material at a much more rapid rate, typically by a factor of 10 to 1, than the lower conductivity material, i.e., layer 72. Typically the current density ranges from 40 to 100 ma./cm.$^2$ at 25° C. when silicon is etched with 5 percent hydrofluoric acid. The assembled carrier 77 and block 70 is maintained within bath 83 for a period of time sufficient to remove all of the substrate region 71, whereby a thin slice, i.e., layer 72, is formed having the suitable ions or impurities implanted therein at a discrete portion 72(*b*) thereof, as is shown in FIG. 3.

Figure 4:
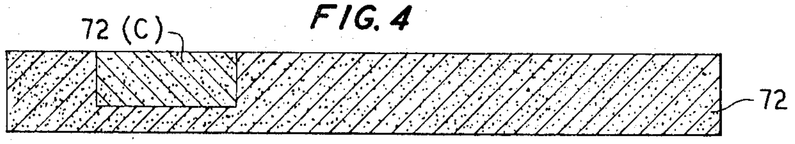
FIG. 4 is a cross-sectional view of the resultant electroetched semiconductor slice after it has been sufficiently heat treated to activate the implanted ions.

The resultant ion-implanted thin slice 72 is removed from the electrochemical etching apparatus and is then subjected to a heat treatment or an annealing procedure, well known in the art, whereby the suitably implanted ions are activated. The heat treatment is carried out at a temperature substantially less than the melting point of the crystal involved, i.e., the semiconductor slice or layer 72, for a period of time sufficient to correct any lattice defects caused by the ionic bombardment and to activate the implanted ions. Typically the heat treatment or annealing is carried out at a temperature in the range of 700°–1,100° C. where silicon is the semiconductor material utilized. The activated ions now change the conductivity of portion 72(*b*) i.e., the conductivity of the semiconductor body encompassed by portion 72(*b*). For example, *n*-type silicon is changed in either type, to *p*-type silicon, or is changed in magnitude, to *n*+ type silicon, thereby forming a desired discrete doped portion or region 72(*c*) of different conductivity, as is shown in FIG. 4.

Figure 5:
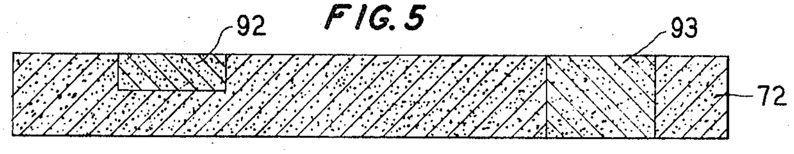
FIG. 5 is a cross-sectional view of a typical semiconductor slice having discrete portions therein of different conductivity.

It is, of course, understood that the doping profiles, i.e., the discrete portions of the thin semiconductor slice, having different conductivity, may be controlled in three dimensions by modulating the energy, current and position of the ion beam as well as by suitable masking techniques. Also, it is understood that typical semiconductor slices having different conductivity-type discrete portions can be obtained through the inventive method disclosed. This is illustrated in FIG. 5 where a thin semiconductor slice 72, e.g., silicon, has a first portion of different conductivity 92, e.g., *n*+ silicon and a second portion 93 of a different conductivity, which differs in type from the first portion 92, e.g., *p*-type silicon. It should also be noted that with the inventive method described, it is now possible to obtain a discrete portion of different conductivity, e.g., *p*-type silicon, in a thin slice of semiconductive material, e.g., *n*-type silicon, which extends completely through the epitaxially deposited layer (layer 72, FIG. 1C). This is shown in FIG. 5, wherein portion 93 extends completely through slice 72. In order to achieve this, referring back to FIG. 1C, the ion-implantation is carried out so that the implanted ions are implanted to a depth which reaches the epitaxial layer 72—substrate layer 71 interface. In this regard, it is of course understood that the discrete portion of different conductivity may be obtained in any desired configuration using the inventive method disclosed.

Figure 6:
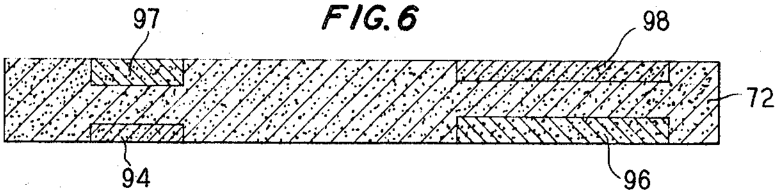
FIG. 6 is a cross-sectional view of a second typical semiconductor slice having discrete portions therein of different conductivity.

Referring to FIG. 1C, the inventive technique can also be employed to first implant ions through the epitaxially deposited layer 72 to the interface of the epitaxial layer 72 and the substrate layer 71 of block 70, to produce a first set of a plurality of discrete portions of different conductivity which may be the same type, e.g., *n*+ silicon or *p*-type silicon, or of differing type, e.g., *n*+ silicon and *p*-type silicon. Then ions can be implanted at the top of slice or layer 72 to form a second set of a plurality of discrete portions of different conductivity. After the subsequent etching and annealing steps the slice 72 has discrete doped portions on both sides. Employing this technique, a typical thin slice semiconductor illustrated in FIG. 6 can be obtained. The semiconductor slice 72 has a first set of discrete portions 94, 96 and a second set of discrete portions 97, 98.

Figure 7:
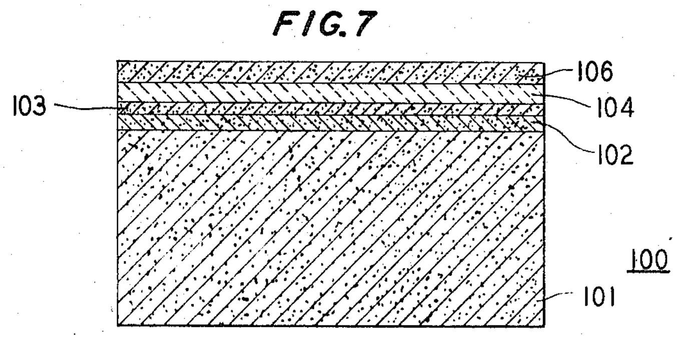
FIG. 7 is a cross-sectional view of a particular block of semiconductive material selected.

Referring now to an exemplary technique, as described by a first example, a block of material 100, having a suitable substrate layer 101, as illustrated in FIG. 7, was selected. The substrate 101 was a 127μ thick *n*+ silicon slice doped with antimony to give a resistivity of 0.001 ohm-cm. Epitaxially deposited, utilizing standard growth techniques known in the art, upon substrate 101 was a 7μ thick *n*-type, <100>, silicon layer 102. Silicon region 102 was doped with arsenic to give a resistivity of 4.6 ohm-cm. The *n*-type region 102 was exposed to a standard ion implantation source, utilizing techniques well known in the art, whereby the region 102 was implanted with 300 kev. phosphorous ions to a dose of $4(10)^{15}$ cm.$^{-2}$, forming an ion-implanted portion or layer 103 which was ⅓μ in depth.

Deposited atop layer 103, using techniques known in the art, was a first layer of silicon oxide 104 and a second layer of polycrystalline silicon 106. Layers 104 and 106 were suitably masked, utilizing techniques well known in the art, against the subsequent electroetching to which block 100 was to be subjected. A sapphire carrier was affixed by means of paraffin to block 100 at layer 106 in a manner similar to that described in FIG. 2, and the semiconductive block 100, with regions or layers 101, 102, 103, 104, and 106, was affixed to an apparatus similar to that described in FIG. 2. A polytetrafluoroethylene container was selected and an electrolytic etching bath composed of 5 percent by weight hydrofluoric acid was prepared. A platinum electrode was inserted into the bath and connected by suitable means to the negative pole of a battery. A suitable means was affixed at the junction of the *n*+ silicon substrate 101 and the *n*-type silicon region or layer 102, thereby connecting the block 100 to the positive pole of the battery. The block 100 was made electrically positive with respect to the platinum electrode. The temperature of the electroetching bath was maintained at 25° C., and the block 100 was completely immersed into the hydrofluoric acid in a similar manner as that illustrated in FIG. 2.

A potential of 5 volts was applied to block 100 to maintain a constant current density of 40 ma./cm.$^2$ in the hydrofluoric acid thereby resulting in the selective electroetching of the *n*+ silicon substrate 101. There was no etching of layer 103 or of the epitaxial layer 102 lying thereunder. The resultant thin slice of *n*-type silicon 102, having a phosphorous ion-implanted layer 103, was then subjected to an annealing treatment, using standard techniques known in the art, at a temperature of 809° C. for a period of 30 minutes, thereby yielding an *n*-type silicon slice having a discrete portion or layer 103 of different conductivity, i.e., an *n*+ silicon portion or layer.

Referring now to a second example, a block of material similar to that illustrated in FIG. 1 was selected. The substrate 101 was a 127μ thick *n*+ silicon slice doped with antimony to give a resistivity of 0.001 ohm-cm. Epitaxially deposited, utilizing standard growth techniques known in the art, upon substrate 101 was a 7μ thick, 100 *n*-type silicon layer 102. Silicon layer 102 was doped with arsenic to give a resistivity of 4.6 ohm-cm. The *n*-type region 102 was exposed to a standard ion-implantation source, utilizing techniques well known in the art, whereby the region 102 was implanted with 300 kev. phosphorous ions to a dose of $2(10)^{14}$ cm.$^{-2}$, forming an ion-implanted portion or layer 103, which was ⅓μ in depth. Again a first layer 104 composed of silicon oxide was deposited atop layer 103 and a second layer 106 of polycrystalline silicon was deposited upon layer 104.

Layers 104 and 106 were suitably masked and the procedure as described in the first descriptive example was repeated employing the same technique, reagents, current density, temperatures and time. The resultant thin *n*-type silicon slice was not etched nor was the ion-implanted layer 103 which, upon heat treatment, was converted or activated to an *n*+ silicon portion or layer.

What is claimed is:

1. A method for preparing a thin slice of a semiconductor material of a first conductivity type, having therein at least one discrete portion of different conductivity from a block of semiconductive material having at least one first region of said first conductivity type and at least one second region of a different conductivity, which comprises the steps of:

a. exposing the block to an ion-implantation source to implant suitable ions in at least one discrete portion of the first region;

b. introducing said resultant ion-implanted block to a suitable electroetching bath to selectively electroetch the second region thereby forming a thin slice of first conductivity type material having suitable ions implanted therein; and c. thermally treating said resultant ion-implanted thin slice to activate said implanted ions to form the thin slice of first conductivity type material having therein at least one discrete portion of different conductivity.

2. The method as defined in claim 1 wherein said semiconductor material is silicon.

3. The method as defined in claim 2 wherein said first conductivity type is *n*-type silicon.

4. The method as defined in claim 2 wherein at least one discrete portion of different conductivity is selected from the group consisting of *n*+ silicon, *p*-type silicon, or mixtures thereof.

* * * * *